United States Patent [19]
Hirai et al.

[11] Patent Number: 5,145,720
[45] Date of Patent: Sep. 8, 1992

[54] CHEMICAL VAPOR DEPOSITION OF DENSE AND TRANSPARENT ZIRCONIA FILMS

[75] Inventors: Toshio Hirai, Izumi; Hisanori Yamane, Sendai, both of Japan

[73] Assignee: Sumitomo Metal Mining Co., Ltd., Tokyo, Japan

[21] Appl. No.: 477,425

[22] Filed: Feb. 9, 1990

Related U.S. Application Data

[62] Division of Ser. No. 161,101, Feb. 26, 1988, Pat. No. 4,920,014.

[30] Foreign Application Priority Data

Feb. 27, 1987 [JP] Japan .................................. 62-44687
Feb. 27, 1987 [JP] Japan .................................. 62-44688
Feb. 27, 1987 [JP] Japan .................................. 62-44689
Sep. 18, 1987 [JP] Japan .................................. 62-235896

[51] Int. Cl.$^5$ .................... C23C 16/08; C23C 16/40
[52] U.S. Cl. ..................... 427/255.3; 427/255.2; 427/314
[58] Field of Search ............. 427/255.2, 255.3, 314, 427/126.3; 156/613, 614; 423/608; 428/702

[56] References Cited

U.S. PATENT DOCUMENTS 3,365,316 1/1968 Kingery et al. ............... 156/614
4,810,530 3/1989 D'Angelo et al. ............ 427/255.3
4,844,951 7/1989 Sarin et al. .................. 427/255.3

OTHER PUBLICATIONS

Wahl et al., *Proc. 7th Int. Conf. on CVD*-1979 (The Electrochemical Soc., Proc. vol. 79-3) pp. 536-548.
Powell et al., *Vapor Deposition*, (John Wiley, New York), c. 1966, pp. 398-401.
Bunshah et al., *Deposition Technologies for Films & Coatings*, (Noyes, Park Ridge, N.J.) c. 1982, pp. 335, 357-359.

Primary Examiner—Shrive Beck
Assistant Examiner—Roy V. King
Attorney, Agent, or Firm—Oblon, Spivak, McClelland, Maier & Neustadt

[57] ABSTRACT

A chemical vapor deposition method is disclosed for forming a dense and transparent or semitransparent zirconia film on a substrate which has substantially one or two kinds of particular planes such as (200), (111) or ($\bar{1}$11) planes only oriented in parallel to the surface of the substrate.

6 Claims, 1 Drawing Sheet

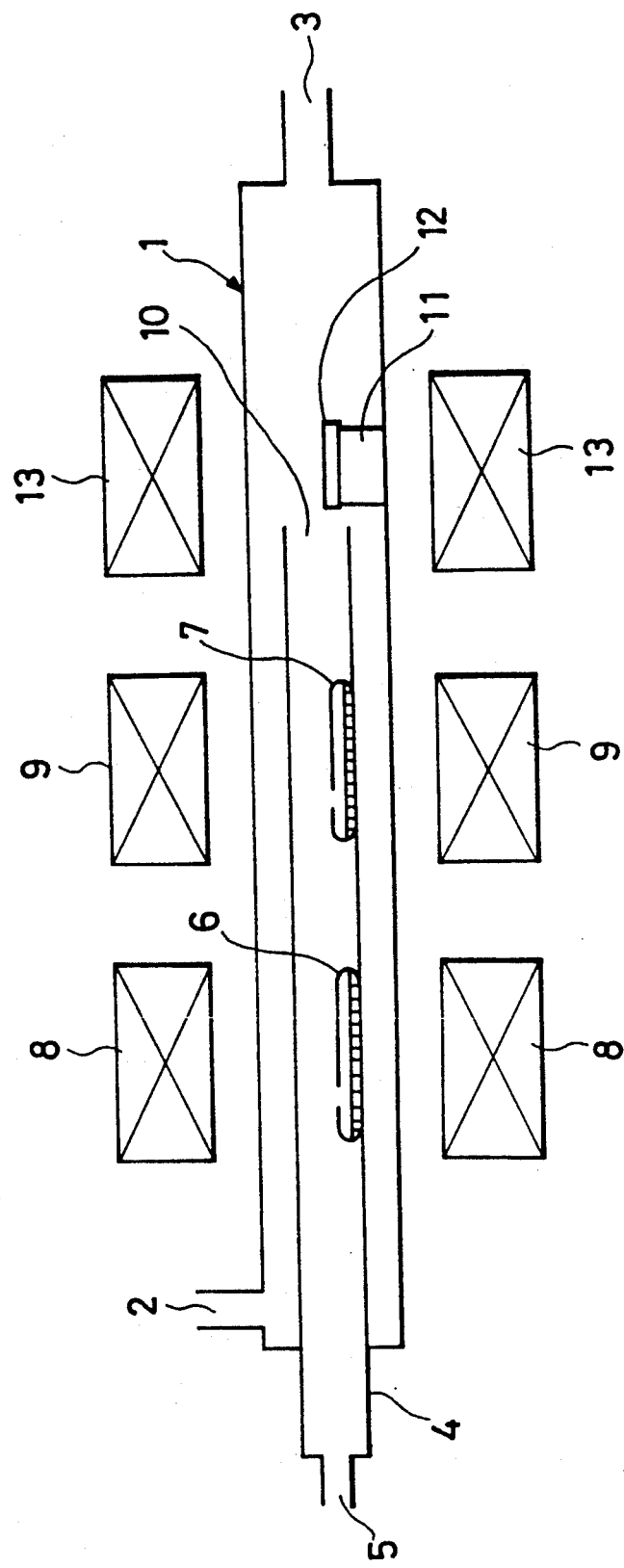

CHEMICAL VAPOR DEPOSITION OF DENSE AND TRANSPARENT ZIRCONIA FILMS

This is a division of application Ser. No. 07/161,101, filed on Feb. 26, 1988, now U.S. Pat. No. 4,920,014.

BACKGROUND OF THE INVENTION

1. Field of the invention

This invention relates to a novel zirconia film and a process for preparing it more particularly, it is concerned with a zirconia film which is dense and improved in the thermal resistance, thermal insulation properties and corrosion resistance, and a process for preparing it.

2. Description of prior art

In general, zirconia films have excellent thermal resistance, thermal insulation properties and corrosion resistance, and are used as materials for protecting surfaces of metals or the like. In particular, zirconia in which $Y_2O_3$, CaO or the like has been added is called "stabilized zirconia" or "partially stabilized zirconia", which is known to have the advantage that it is free from, or lightened of, the volume changes accompanied by phase transformations inherently occurring in zirconia at about 1,100° C. and can be hardly broken for that reason. A film of this stabilized or partially stabilized zirconia has so high refractive index and so high oxygen ion conductivity that it is expected to be utilized in various uses as an optical functional film material, an oxygen sensor, a solid electrolyte for third-generation fuel cells and so forth.

Conventionally known processes by which such a zirconia film is prepared include chemical vapor deposition processes (which is hereinafter called "CVD processes"), as being relatively high in the film formation rate and being easy to handle. Along the CVD processes, noted is a process in which oxygen is used as an oxidizing agent as being advantageous in that it can be more industrial and have a high safety. This process is a process in which there are used zirconium halide as a zirconium source, oxygen gas as an oxidizing agent and, where the stabilized or partially stabilized zirconia film is prepared, a halide of yttrium or the like as a stabilizing agent, and these are previously mixed and introduced into a reaction vessel provided with a pressure kept at 900° to 1,400° C. under atmospheric pressure to form a film on the substrate (G. Wehl et al., Proc. CVD-VII, 536 (1979)).

However, the zirconia film obtained by the above conventional process has the problem that it can have only insufficient thermal resistance, thermal insulation properties, corrosion resistance, etc because of its low denseness.

SUMMARY OF THE INVENTION

Accordingly, an object of this invention is to provide a zirconia film which is highly dense and therefore has high thermal resistance, thermal insulation properties, corrosion resistance, etc., and a process for preparing the same.

As such a zirconia film, this invention provides a zirconia film comprising a zirconia film formed on a substrate, wherein substantially one or two kinds of particular crystal planes only are oriented in parallel to the surface of said substrate.

The zirconia film of this invention is dense and has thermal resistance, thermal insulation properties, corrosion resistance, etc. that are superior to any conventional zirconia films, and moreover can be prepared by a simple process and apparatus. Especially, the process described herein can be carried out at atmospheric pressure, can be readily suited for the continuous preparation, and can be industrially advantageous.

BRIEF DESCRIPTION OF THE DRAWING

FIG. 1 schematically illustrates an example of an apparatus used in preparing the zirconia film of this invention.

DETAILED DESCRIPTION OF THE INVENTION

The zirconia film of this invention includes films comprising substantially pure zirconia and those comprising zirconia containing the stabilizing element described below, namely, the so-called stabilized or partially stabilized zirconia.

Herein, the "stabilizing element" refers to, for example, Ca, Mg, Y, and the like, and the "stabilized or partially stabilized zirconia" refers to a zirconia comprising zirconia ($ZrO_2$) incorporated with any of these stabilizing elements as an oxide, for example, CaO, MgO and $Y_2O_3$ in an amount of 20 mol % or less to form a solid solution. This oxide of stabilizing elements may be contained usually in an amount of from 3 to 20 mol % in the case of $Y_2O_3$, from 4 to 15 mol % in the case of CaO, and from 2 to 12 mol % in the case of MgO. In general, a zirconia containing the oxide of stabilizing elements in an amount of from 8 to 20 mol % is called the stabilized zirconia, and a zirconia containing the same in an amount less than 8 mol % is called the partially stabilized zirconia.

In this invention, what is meant by "one or two kinds of particular crystal planes only are oriented in parallel to the surface of said substrate" is that in the instance where the particular crystal planes are present in one kind, assuming the diffraction intensity of the particular crystal planes as 100 in measurement by X-ray diffraction, the diffraction intensities of other crystal planes are all less than 20. In the instance where the particular crystal planes are present in two kinds, assuming as 100 the diffraction intensity of either one.-having highest diffraction intensity among the particular crystal planes, the diffraction intensity of the other particular crystal planes is 20 to 100 and the diffraction intensities of other crystal planes are all less than 20.

In the zirconia film of this invention, the particular crystal planes oriented in parallel to the surface of the substrate may include, for example (111) planes, (200) planes and ($\bar{1}$11) planes.

As a first embodiment of this invention, this invention provides a zirconia film wherein substantially ($\bar{1}$11) planes only are oriented in parallel to the surface of the substrate and the zirconia film consists of substantially pure zirconia ($ZrO_2$).

The zirconia film according to this embodiment has a high transparency and is dense, so that the thermal resistance, thermal insulation properties and corrosion resistance are improved.

The zirconia film according to this embodiment can be prepared by a process for preparing a zirconia film on a substrate by CVD with use of a zirconium halide and oxygen gas as an oxidizing agent, wherein said oxygen gas and said zirconium halide are separately fed to a reaction zone defined in the vicinity of said substrate kept at 700° to 1,400° C. In this preparation process, the substrate is kept at 700° to 1,400° C., preferably at 1,000° to 1,100° C. The substrate temperature of less than 700° C. may cause deposition of the starting zirconium halide on the substrate in an undecomposed state, and that of more than 1,400° C. makes it difficult to obtain the zirconia film wherein substantially ($\bar{1}$11) planes only are oriented in parallel to the surface of the substrate.

In a second embodiment of the zirconia film of this invention, this invention provides a zirconia film wherein substantially one or two kinds of crystal planes only, selected from the group consisting of (111) planes and (200) planes, are oriented in parallel to the surface of a substrate and the zirconia film consists of a stabilized or partially stabilized zirconia.

The zirconia film according to this second embodiment can be prepared by a process for preparing a stabilized or partially stabilized zirconia film on a substrate by CVD with use of a zirconium halide, a halide of a stabilizing element and oxygen gas as an oxidizing agent, wherein said oxygen gas is fed separately from said zirconium halide and said halide of the stabilizing element to a reaction zone defined in the vicinity of said substrate kept at 1,000° to 1,400° C. In this preparation process, the substrate is kept at 1,000° to 1,400° C., preferably at 1,100° to 1,200° C. The substrate temperature of less than 1,000° C. may cause deposition of the starting zirconium halide on the substrate in an undecomposed state, and that of more than 1,400° C. makes it difficult to obtain the zirconia film wherein substantially (111) planes and/or (200) planes only are oriented in parallel to the surface of the substrate.

Examples of the zirconia film according to the second embodiment include those in which the particular crystal planes parallel to the surface of the substrate are substantially (200) planes only, those in which they are substantially (200) planes and (111) planes only, and those in which they are substantially (111) planes only. The kind of such particular crystal planes can be selectively determined by controlling the time to feed the zirconium halide and the halide of stabilizing agents to the reaction zone in the process for preparing the zirconia film according to the second embodiment described above.

More specifically, the stabilized zirconia film wherein substantially (200) planes only are oriented in parallel to the surface of the substrate can be obtained, in the process described above, by starting to feed the zirconium halide and the halide of stabilizing agents to the reaction zone substantially at the same time. In this instance, the both reactants are, for example, started to be fed within the range of a time lag of 30 seconds or less under a typical reaction condition.

The stabilized zirconia film wherein substantially (200) planes and (111) planes only are oriented in parallel to the surface of the substrate can be obtained, in the process described above, by starting to feed the halide of stabilizing elements to the reaction zone with a delay of several ten seconds to several minutes from the starting of feeding zirconium halide, for example, with a delay of 30 seconds to 4 minutes under a typical reaction condition.

The stabilized zirconia wherein substantially (111) planes only are oriented in parallel to the surface of the substrate can be obtained, in the process described above, by starting to feed the halide of stabilizing elements to the reaction zone with a further delay from the starting of feeding zirconium halide, for example, with a delay more than 4 minutes under a typical reaction condition.

In the above, the delay time necessary for obtaining a particular zirconia film depends on the conditions such as the scale and shape of an apparatus used, the size of a substrate and the feeding rate of material halides. Accordingly, the time mentioned above is merely exemplary. However, persons skilled in the art can readily find the delay time suited for each particular preparation condition on the basis of the above description.

The stabilized or partially stabilized zirconia film wherein substantially (200) planes only or substantially (111) planes only are oriented in parallel to the surface of the substrate, according to the second embodiment, is dense, has a high transparency, and more improved in the thermal resistance, thermal insulation properties and corrosion resistance.

In the case of the stabilized or partially stabilized zirconia film comprising substantially (200) planes and (111) planes only, a phase wherein the (200) planes are oriented in parallel to the surface of the substrate usually undergoes face growth in a plate shape to form a matrix phase, and on the other hand a phase wherein the (111) planes are oriented in parallel to the surface of the substrate undergoes grain growth in the vertical direction to the surface of the substrate and dispersed in the above matrix phase in a granular state with a triangular pyramid shape, a regular triangle column shape or a hexagonal column shape. In some cases, there is formed the granular phase wherein its top protrudes from the matrix phase The bond between these two phases are strong and dense, and there is no gap or cracking in the film, so that this film also is improved in the thermal-resistance, thermal insulation properties and corrosion resistance. Also, in the instance in which the phase wherein the pyramid-like or column like grains are formed is in such a state that it protrudes from the flat matrix phase in the shape of projections, the substantial surface area per unit area of this zirconia film is very large. As compared with the one comprising a single phase acordingly, when used, for example, as a solid electrolyte for fuel cells or gas sensors, the contact area with gas can be so large that it can be expected to achieve the gas diffusion more efficiently. Thus, it is possible to realize an improvement in the response performance of gas sensors and an enhancement of the electricity generation efficiency of fuel cells.

The above-mentioned zirconium halide used as a zirconium starting-material for preparing the zirconia film of this invention may include zirconium chloride, zirconium fluoride, zirconium bromide and zirconium iodide, but most preferred in view of vapor pressure or the like is zirconium chloride.

The halide of stabilizing elements, used when the stabilized or partially stabilized zirconia film is prepared, may include chloride, fluoride, bromide and iodide of Ca, Mg or Y. Among these, preferred is yttrium chloride as the amount thereof to be added can be readily controlled.

The zirconium halide and the halide of stabilizing elements are usually vaporized and introduced in the reaction zone in the form of a gas, but these may be introduced separately or may be introduced in a mixed state. In any cases, however, they are introduced in the reaction zone separately from oxygen gas which is the oxidizing agent. These zirconium halide and halide of stabilizing elements are usually introduced into the reaction zone together with a carrier gas, for example, inert gas such as nitrogen and argon. The flow rate for the carrier gas may preferably be 200 to 600 cm/min, particularly preferably 250 to 500 cm/min, in terms of linear velocity. The linear velocity of less than 200 cm/min may result in the formation of powdery products That of greater than 600 cm/min may also cause a lowering of the substrate temperature, requiring care to be taken. When these halides are vaporized, these are usually heated, but the temperature may vary depending on the kind of the compound to be used and the pressure. In general, an overly high temperature may result in overly high vapor pressure of the compound to make it difficult to control the feeding amount, and an overly low temperature may make it difficult to achieve a sufficient feeding amount. A suitable heating temperature can be readily found by persons skilled in the art, and ranges, for example, approximately from 290° to 310° C. under atmospheric pressure in the case of zirconium chloride, and approximately from 900° to 1,000° C. in the case of yttrium chloride.

The ratio of the amount of zirconium halide fed to the reaction zone (herein "A mol/min") to the amount of the halide of stabilizing elements fed thereto (herein "B mol/min") determines the content of the stabilizing element in the resulting zirconia film. To obtain the stabilized or partially stabilized zirconia film of this invention, the feeding amount for the both reactants may desirably be so controlled that the value X represented by the following is 40 or less.

$$X = \frac{B}{A + B} \times 100 \text{ (mol \%)}$$

The feeding amount can be controlled by regulating the carrier gas flow rate and/or the heating temperature for vaporizing the starting materials. In general, the stabilized zirconia film can be obtained when X is about 15 to 40. The partially- stabilized zirconia film can be obtained by quenching a film obtained under the condition of X=15 or less.

The oxygen gas used as the oxidizing agent in the preparation process described above is fed to the reaction zone separately from, i.e., without mixing with, the above zirconium halide and halide of stabilizing elements, and used here for the reaction. If the above oxygen gas is introduced in the reaction zone together with the zirconium halide and/or halide of stabilizing elements, the reaction takes place in gaseous phase undesirably to lower the film formation rate because of the formation of powder or bring about inclusion of powder into the film to be formed. The oxygen gas may be introduced in the form of pure oxygen, or in the form of a mixture with inert gas such as argon and nitrogen. In any of the cases, however, it may preferably be introduced in a linear velocity of from 50 to 100 cm/min. The linear velocity smaller than 50 cm/min may result in insufficiency in the feeding of the gas on the substrate, and that greater than 100 cm/min may result in an overly great ratio of oxygen to the halide starting materials to make liable the formation of powder to occur. In usual cases, the oxygen gas may be previously begun to be fed to the reaction zone, and thereafter the zirconium halide and the halide of stabilizing elements may be started to be fed at a predetermined time.

In the process of this invention, the mixing of oxygen with other reactants is carried out in the reaction zone. The mixing, however, may particularly preferably be carried out in a zone within 40 mm from the surface of the substrate, more preferably in a zone within 20 mm.

Mixing within a zone exceeding 40 mm may result in the formation of a porous film, even with crystal planes non-oriented or only a little oriented.

The pressure used when carrying out the preparation of the zirconia film may preferably be in the range of 100 to 800 Torr in any of the above instances. In usual instances, a satisfactory result can be obtained at atmospheric pressure. This is an advantage in the process of this invention.

According to the above processes, the zirconia film can be obtained at a growth rate of 1 to 10 μm/hr.

Materials for the substrate on which the zirconia film of this invention is formed may include, for example, polycrystals or monocrystals of inorganic materials such as quartz, alumina, zirconia and magnesia, and glass.

An apparatus for working the preparation process described above can be exemplified by an apparatus used in Examples described below, but any of apparatus can be used so long as they can achieve the above conditions.

This invention will be described below in greater detail by way of Examples, but by no means limited to these.

EXAMPLES

Example 1

A reaction apparatus shown in FIG. 1 was used. In FIG. 1, a reaction tube 1 made of quartz glass and having an inner diameter of 19 mm is provided with an oxygen gas inlet 2 and a gas outlet 3. In the inside of this reaction tube, there is provided an inner tube 4 with an inner diameter of 8 mm for introducing halides, comprised of a quartz glass tube, which is constituted such that an inert gas such as argon can be flowed from the inlet 5. In the inside of the inner tube 4, there are disposed a container 6 that can contain zirconium halide and vaporize it and a container 7 that can contain a halide of stabilizing elements and vaporize it. These containers 6 and 7 were made by sealing both ends of a quartz tube with an outer diameter of 6 mm and making a hole in its side wall. These containers 6 and 7 are heated to temperatures respectively prescribed, by means of electric furnaces 8 and 9 externally provided, respectively. The halides vaporized are carried by the inert gas such as argon flowed in from the inlet 5, and fed to the reaction vessel 1 from an inner tube outlet 10. In the vicinity of the outlet of the inner tube 4 for introducing the halides, a substrate 12 is set on a substrate stand 11 at a position 5 mm distant from the outlet 10 of said inner tube 4. The substrate 12 is heated by an electric furnace 13 externally provided, so as to have a prescribed temperature, and the starting halides are brought into reaction with oxygen gas, whereby the stabilized or partially stabilized zirconia film can be formed on the substrate.

In the present Example, used as the zirconium halide was zirconium chloride, and as the halide of stabilizing elements, yttrium chloride.

Previously flowed in the inner tube 4 for feeding the starting materials, were pure oxygen gas from the oxygen gas inlet 2 at a rate of 170 ml per minute (60 cm/min) and argon gas from the inlet 5 at a rate of 160 ml per minute (318 cm/min). While flowing oxygen gas and argon gas, simultaneously heated were the zirconium chloride in the container 6 to 300° C. by means of the electric furnace 8 and the yttrium chloride in the container 7° to 950° C. by means of the electric furnace 9. At this time, the proportion of the feeding amount for yttrium chloride to the total of the feeding amounts (mol/min) for zirconium chloride and yttrium chloride was varied to 10 mol %, 20 mol % and 30 mol %, and formation of the zirconia film was carried out for each instance. The substrate used was a quartz glass plate measuring 10×40×1 mm, and the film formation was carried out for 1 hour, keeping the temperature at 1150° C.

All of the zirconia films thus obtained were about 2 μm in thickness, in the shape of plates having smooth surfaces, and semitransparent. As a result of X-ray diffraction, all films showed a greatest diffraction intensity for (200) planes, and, assuming this intensity as 100, the diffraction intensity for (400) planes was 14 and the diffraction intensities for other planes were all less than 1. The resulting zirconia films were highly transparent and dense, and showed high corrosion resistance

Example 2

Operations in Example 1 were repeated except that the zirconium chloride and yttrium chloride were heated in the following manner. First, by means of the electric furnace 8 the zirconium chloride in the container 6 was heated to 300° C., and by means of the electric furnace 9 the yttrium chloride in the container 7, to 800° C., whereby the zirconium chloride was vaporized and started to flow into the reaction vessel 1. After lapse of 1 minute, the electric furnace 9 was controlled to increase the temperature for heating yttrium chloride to 950° C., whereby the yttrium chloride was vaporized and started to be fed into the reaction tube 1.

In any instances in which the proportion of the feeding amount for yttrium chloride to the total of the feeding amounts (mol/min) for zirconium chloride and yttrium chloride was 10 mol %, 20 mol % or 30 mol %, all of the resulting zirconia films were about 2 μm in thickness, and semitransparent. The resulting zirconia films were observed by a scanning type electron microscope to reveal that crystal phases comprising projections having shapes of regular triangle pyramids or regular triangle columns with 1 to 3 μm in length of one side, having flatness on their tops, were interspersed in a flat-phase spreading over the whole and at a proportion of about 10% of the whole film area, and also the bond between the flat phase and the projected crystal phases was strong and dense.

Also, as a result of the X-ray diffraction, all zirconia films showed a greatest diffraction intensity for (200) planes, and, assuming this intensity as 100, the diffraction intensities for other planes were as shown in Table 1.

TABLE 1

| | Miller Indices | | | | | |
|---|---|---|---|---|---|---|
| | (111) | (200) | (220) | (311) | (222) | (400) |
| Relative Intensity | 20 | 100 | 4 | 3 | 1 | 15 |

Example 3

Example 2 was repeated to obtain zirconia films, except that 3 minutes after heating of zirconium chloride to 300° C. and yttrium chloride to 800° C., the temperature of yttrium chloride was increased to 950° C., whereby the yttrium chloride was vaporized and started to be fed into the reaction tube 1.

All of the resulting zirconia films were about 2 μm in thickness and semitransparent. The resulting zirconia films were observed by a scanning type electron microscope to reveal that crystal phases comprising projections having shapes of regular triangle pyramids, regular triangle columns or regular hexagonal columns with 2 to 3 μm in length of one side, having flatness on their tops, were interspersed in a flat phase spreading over the whole and at a proportion of about 60% of the whole film area, and also the bond between the flat phase and the crystal phases comprising the projections having flatness on their tops was strong and dense.

Also, as a result of the X-ray diffraction, all zirconia films showed a greatest diffraction intensity for (111) planes, and, assuming this intensity as 100, the diffraction intensities for other planes were as shown in Table 2.

TABLE 2

| | Miller Indices | | | | | |
|---|---|---|---|---|---|---|
| | (111) | (200) | (220) | (311) | (222) | (400) |
| Relative Intensity | 100 | 80 | 6 | 4 | 5 | 8 |

Example 4

Operations of Example 1 were repeated except that zirconium chloride and yttrium chloride were heated in the following manner: First, zirconium chloride was heated to 300° C., and yttrium chloride, to 800° C. After lapse of 5 minutes, the heating temperature for yttrium chloride was increased to 950° C.

In any instances in which the proportion of the feeding amount for yttrium chloride to the total of the feeding amounts (mol/min) for zirconium chloride and yttrium chloride was 10 mol %, 20 mol % or 30 mol %, all of the resulting zirconia films were about 2 μm in thickness, of hexagonal column-like structure, and semitransparent. Also, as a result of the X-ray diffraction, all zirconia films showed a greatest diffraction intensity for (111) planes, and, assuming this intensity as 100, the diffraction intensity for (222) planes was 6, the diffraction intensity for (220) planes was 1, and the diffraction intensities for other planes were all less than 1.

The resulting zirconia films were highly transparent and dense, and showed high corrosion resistance.

Example 5

The apparatus of FIG. 1 was used but placing zirconium chloride in the container 7 and not using the container 6 and the electric furnace 8.

Previously flowed were 170 ml per minute (60 cm/min) of pure oxygen gas from the oxygen gas inlet, and 160 ml per minute (318 cm/min) of argon gas into the inner tube for feeding starting material, and thereafter zirconium chloride was heated to 300° C. A quartz glass plate measuring 10×40×1 mm was used as a substrate, and the film formation was carried out for 1 hour, keeping the temperature at 1100° C.

The resulting zirconia film was about 6 μm in thickness, of column-like structure, and semitransparent. As a result of the X-ray diffraction, the resulting zirconia film showed a greatest diffraction intensity for ($\bar{1}$11) planes, and, assuming this intensity as 100, the diffraction intensity for (111) planes was 14, the diffraction intensity for ($\bar{2}22$) planes was 3, and the diffraction intensities for other planes were less than 1.

The resulting zirconia films were highly transparent and dense, and showed high corrosion resistance.

What is claimed is:

1. A process for preparing a dense and transparent or semitransparent zirconia film formed on a substrate, having substantially (111) planes only oriented parallel to the surface of said substrate, and consisting of substantially pure zirconia, said process comprising:

separately feeding an oxygen gas and a zirconium halide without mixing the reactants to a reaction zone which is up to 20 mm from the surface of said substrate kept at 700° to 1,400° C. under a pressure of 100 to 800 Torr.

2. The process of claim 1, wherein said zirconium halide is zirconium chloride.

3. A process for preparing a dense and transparent or semitransparent zirconia film formed on a substrate, having substantially one or two kinds of crystal planes only, selected from the group consisting of (111) planes and (200) planes, oriented parallel to the surface of said substrate, and consisting of a stabilized or partially stabilized zirconia, said process comprising:

feeding an oxygen gas separately from a zirconium halide and a halide of a stabilizing element without mixing these reactants to a reaction zone which is up to 20 mm from the surface of said substrate kept at 1,000° to 1,400° C. under a pressure of 100 to 800 Torr.

4. The process of claim 3, wherein the zirconium halide is zirconium chloride and the halide of a stabilizing element is yttrium chloride.

5. The process of claim 3, wherein the zirconium halide and the halide of a stabilizing element are substantially simultaneously fed to the reaction zone to form a zirconia film having substantially (200) planes only oriented parallel to the surface of said substrate.

6. The process of claim 3, wherein the halide of a stabilizing element is started to be fed to the reaction zone substantially with a delay from the starting of feeding the zirconium halide, to form a zirconia film having substantially (111) planes and (200) planes only, or (111) planes only, oriented parallel to the surface of said substrate.

* * * * *